United States Patent [19]
Joshi

[11] Patent Number: 5,621,227
[45] Date of Patent: Apr. 15, 1997

[54] METHOD AND APPARATUS FOR MONOLITHIC OPTOELECTRONIC INTEGRATED CIRCUIT USING SELECTIVE EPITAXY

[75] Inventor: Abhay M. Joshi, Plainsboro, N.J.

[73] Assignee: Discovery Semiconductors, Inc., Cranbury, N.J.

[21] Appl. No.: 503,726

[22] Filed: Jul. 18, 1995

[51] Int. Cl.$^6$ ............... H01L 31/0328; H01L 31/0336; H01L 31/072; H01L 31/109
[52] U.S. Cl. ............... 257/184; 257/185; 257/190; 257/200
[58] Field of Search ................................. 257/184, 185, 257/190, 200

[56] References Cited

U.S. PATENT DOCUMENTS

| | | | |
|---|---|---|---|
| 4,996,163 | 2/1991 | Sasaki | 257/184 |
| 5,144,379 | 9/1992 | Eshita et al. | 257/190 |
| 5,242,839 | 9/1993 | Oh et al. | 257/292 |
| 5,387,796 | 2/1995 | Joshi et al. | 250/365 |

FOREIGN PATENT DOCUMENTS 61-104658  5/1986  Japan.

OTHER PUBLICATIONS

A.M. Joshi and F.J. Effenberger, "Monolithic InGaAs–on–Silicon Detector with a CMOS Switched Capacitor Integrator," SPIE Proceedings—Fiber Optic Materials and Components, vol. 2290, Jul. 28–29, 1994, pp. 430–437.

*Primary Examiner*—Stephen Meier
*Attorney, Agent, or Firm*—Watov & Kipnes, P.C.

[57] ABSTRACT

A monolithic Optoelectronic Integrated Circuit including a photodiode and a CMOS readout circuit is described in which the diode is formed by compositionally graded layers of $In_xGa_{1-x}As$ selectively epitaxially grown between a substrate of Si and an absorption layer of $In_xGa_{1-x}As$, the areas of said layers being less than 500 $\mu m^2$ and wherein a readout circuit on said substrate is coupled to said diode.

10 Claims, 8 Drawing Sheets

METHOD AND APPARATUS FOR MONOLITHIC OPTOELECTRONIC INTEGRATED CIRCUIT USING SELECTIVE EPITAXY

FIELD OF THE INVENTION

The field of the present invention relates generally to photodetectors, and more particularly to photodetector diodes included in integrated circuit form.

BACKGROUND OF THE INVENTION

Photodetectors are comprised of a diode that permits an amount of current to flow through it that is proportional to the intensity of light with which it is illuminated and a readout circuit for producing a voltage corresponding to the current flowing through the diode and hence also corresponding to the intensity of the light. Diodes using InGaAs are superior to those using Gi, HgCdTe,PtSi or InSb for certain applications because of their higher sensitivity, faster operation and the fact that they function well at room temperature.

If an InGaAs diode were epitaxially grown on the Si substrate on which the readout circuitry is preferably formed, the lattice mismatch would have so many dislocations as to cause sufficient leakage current to seriously degrade diode performance. For this reason a hybrid structure has been used for several years wherein the diode is separate from the substrate and coupled to its readout circuit thereon by wire or Indium bump bonds. Unfortunately, however, such connections are susceptible to vibration failure in a space launch and are plagued by parasitic capacitance and inductance that lower their reliability and decrease their bandwidth. Furthermore, extensive packaging efforts are required in order to form an array of such detectors.

As reported in Journal Applied Physics (Vol. 65(6), pg. 2220–2237, 1989), E. A. Fitzgerald et al have selectively grown $In_{0.05}Ga_{0.95}As$ on GaAs substrates with very few dislocations by confining the epitaxial growth to a location that is square or circular having an area of $(100 \times 100) \mu m^2$ or less.

It is also known that if a desired epitaxial layer has a lattice that is severely mismatched with the lattice of a substrate on which it is epitaxially grown as to severely limit the operation of a device of which it is a part. In such a case, the desired epitaxial layer can be compositionally graded to the substrate via successive epitaxial layers in which the ratio of the elements respectively changes from that of the desired composition to a composition having far less lattice mismatch with the substrate.

SUMMARY OF THE INVENTION

In accordance with this invention, a photodiode using InGaAs is selectively epitaxially grown on an area of a Si substrate that is less than 500 $\mu m^2$. The desired ratio of In to Ga for the purpose of forming a light absorption layer of a p-n InGaAs diode junction has a lattice constant so high as to form a significant lattice mismatch with Si. Therefore, even if it were grown directly onto a Si substrate within the limited area referred to above, the performance of the diode would be severely impaired by the resulting leakage current. By making the absorption layer having the desired ratio of In to Ga the last of a stack of epitaxially grown InGaAs layers in which the ratio of In to Ga decreases as the substrate is approached, the lattice mismatch with the substrate is reduced so that the amount of leakage current is further reduced to a highly acceptable low value.

In forming the p-n junction, of course, the InGaAs material on one side of the junction is doped so as to be of one conductivity type, and the InGaAs material on the other side of the junction is doped to be of the opposite conductivity type. The material on the same side of the junction as the substrate has the same type of conductivity as the substrate.

Although the stack of epitaxial layers could be grown on the surface of the substrate, still further reduction in leakage current is achieved by growing at least a portion of it in a "well" or "trough" that has been etched in the substrate and its covering layer of $SiO_2$. Although the entire stack could be grown in the substrate, it is preferable that the p-n junction formed in the stack be at the surface of the Si substrate in which event InGaAs material having one conductivity type would be above the surface and in contact with the $SiO_2$ and the InGaAs material of the other conductivity type would be in contact with the Si of the substrate.

Readout circuit elements for the photodetector just described are formed by CMOS processing in the surface of the substrate, and the insulating layer of $SiO_2$ is formed on the surface surrounding the well. Connections between the photodiode and the readout circuit elements are readily formed on the $SiO_2$ layer and make contact with appropriate elements by extending through the $SiO_2$ layer.

In a preferred monolithic structure, the photodiode is formed in the well in one surface of the substrate as described, a conductive layer is formed on the other surface, and diode current flows vertically between the surfaces.

In a less preferred structure, the photodiode is on top of a mesa and ohmic contacts at different points on the p-n junction are such as to form a "lateral" p-i-n diode between them so that the current flow is parallel to the surfaces of the substrate.

Furthermore, the photodetector of this invention is so structured as to make it a simple matter to incorporate a filter for selection of the bandwidth of light whose intensity is to be measured. In particular, it is easy to combine the photodetector with a resonant optical filter by providing layers on top of the photodetector serving as a partial mirror, a fully reflecting layer on the opposite side of the substrate and making the thickness of the substrate such that the distance between the two mirrors is one half the wavelength of the light of interest.

Manufacture of a monolithic photodetector such as described above in accordance with another aspect of the invention involves more steps than can be identified in this summary but in general the readout circuit elements are formed in the substrate, the well is etched and the layers of the stack are epitaxially grown in the well before metallizing to form the circuit interconnections.

BRIEF DESCRIPTION OF THE DRAWINGS

Various embodiments of the present invention are shown and described herein with reference to the drawings, in which like items are identified by the same reference designation, wherein.

DETAILED DESCRIPTION OF THE INVENTION

Figure 1A:
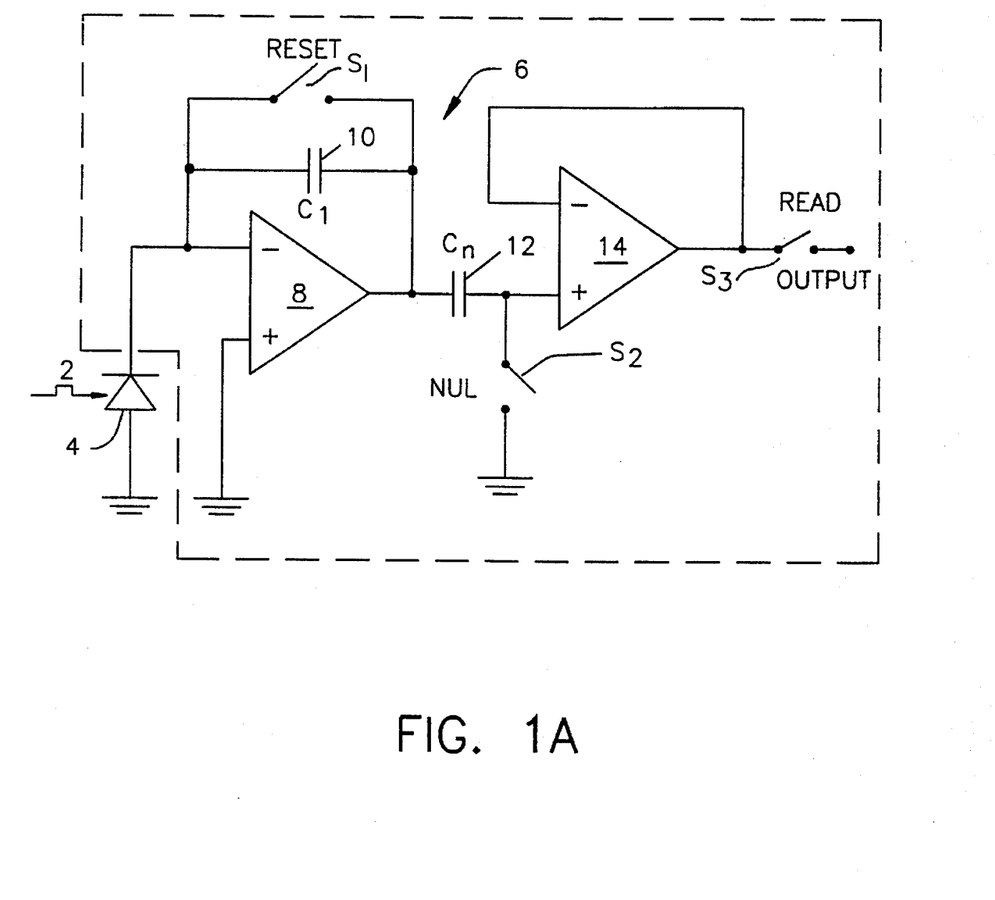
FIG. 1A is a schematic of a circuit of a monolithic photodetector.
Figure 1B:
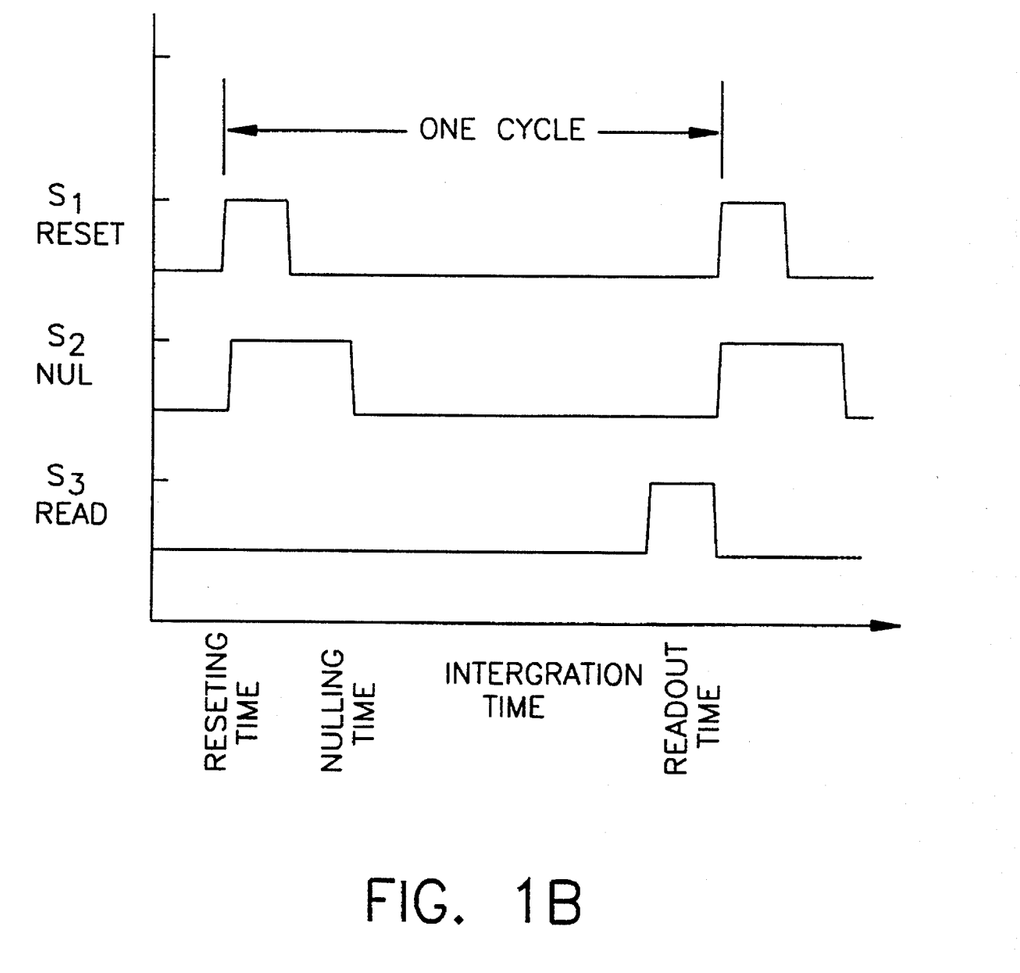
FIG. 1B is a timing diagram for the circuit of FIG. 1A.

In the schematic diagram of a photodetector shown in FIG. 1A light indicated at 2 illuminates a photodiode 4 so as to change its conductivity and thus alter the voltage supplied to a readout circuit 6 at the inverting input of an operational amplifier 8. This invention does not involve the readout circuit per se but merely requires that some readout circuit be incorporated in the monolithic structure. The particular readout circuit shown by way of example is comprised of the operational amplifier 8 connected as an integrator with a capacitor 10 connected between its output and its inverting input and a capacitor 12 connected between its output and a noninverting input of an operational amplifier 14. The output of the amplifier 14 is directly connected to its inverting input so that it operates as a buffer. A switch $S_1$ is connected in parallel with the capacitor 10, a switch $S_2$ is connected between the noninverting input of the amplifier 14 and ground and a switch $S_3$ is connected to the output of the amplifier 14. The switches $S_1$, $S_2$ and $S_3$ operate in the sequence illustrated in FIG. 1B so that the current supplied by the photodiode 4 is integrated over a given period, thereby providing a voltage indicating the intensity of the light 2.

Figure 2A:
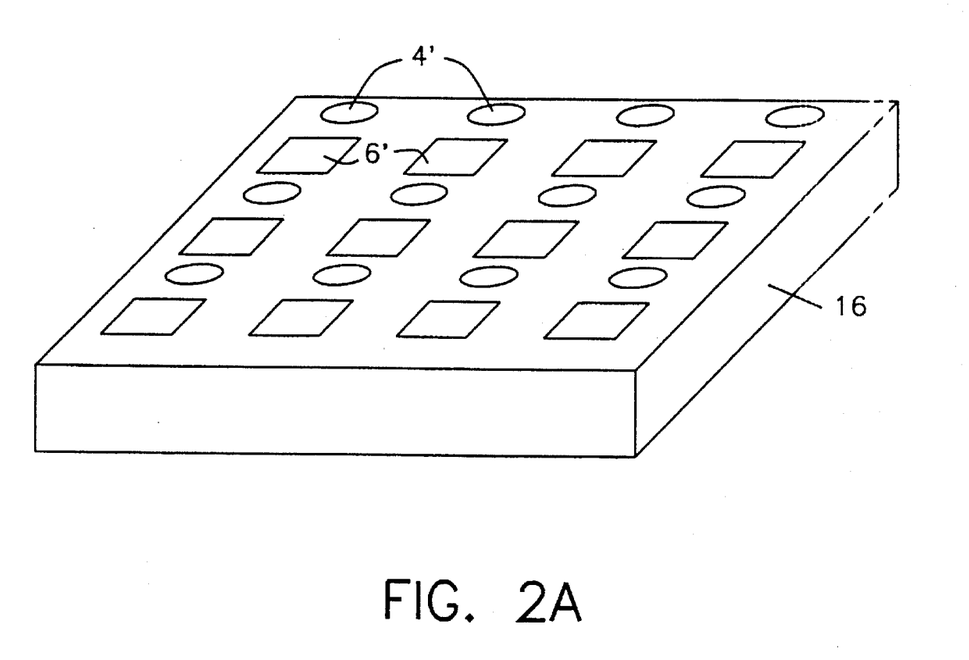
FIG. 2A is an isometric view of the locations of readout circuits and photodiodes of an array in which current flows parallel to the substrate.

In accordance with this invention, the photodiode 4 is formed by selective epitaxial layers of InGaAs that are grown on the same substrate in which the circuit elements of a readout circuit are formed. FIG. 2A is an isometric view of an array of photodetectors in which the photodiodes are located at the circles 4' and the readout circuits are located at the rectangles $6^1$ on a silicon substrate 16. In order to conserve space, the readout circuits $6^1$ could be formed around the photodiodes $4^1$.

Figure 2B:
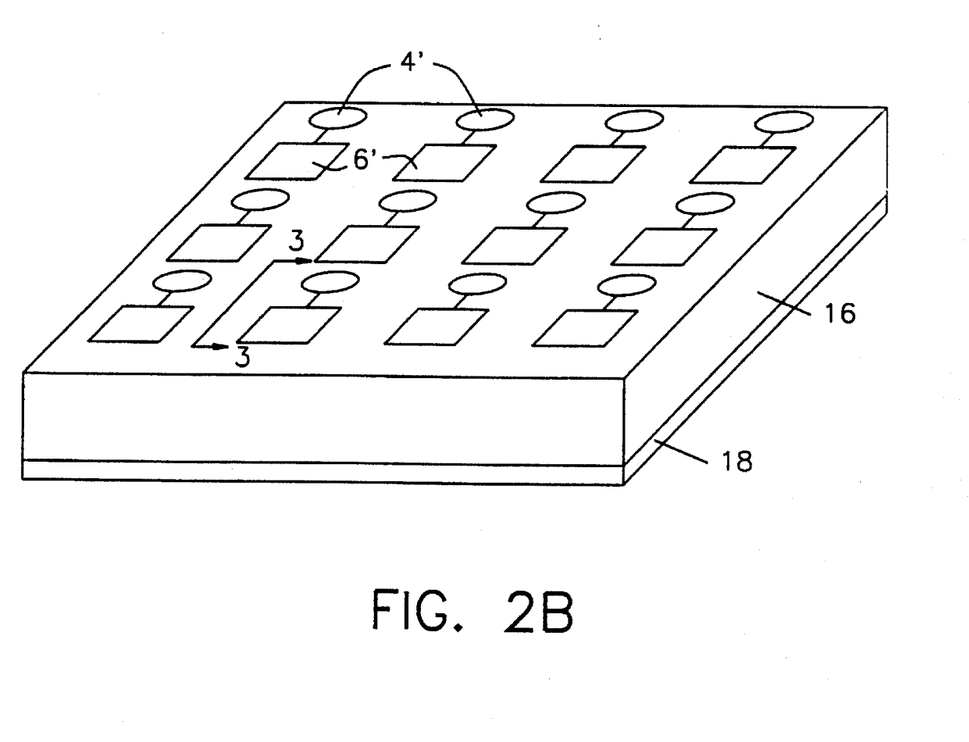
FIG. 2B is an isometric view of the locations of readout circuits and photodiodes in which current flows through to the substrate.

FIG. 2B is the same as FIG. 2A except for the addition of a conductive layer 18 on the surface of the substrate 16 that is opposite to the surface bearing the photodiodes $4^1$ and the readout circuits $6^1$. As will be explained, the purpose of the conductive layer 18 may be to act as a reflector of a resonant optical filter and/or as an electrode of a photodiode $4^1$ in which current flows vertically from one surface of the substrate 16 to the other.

Figure 3:
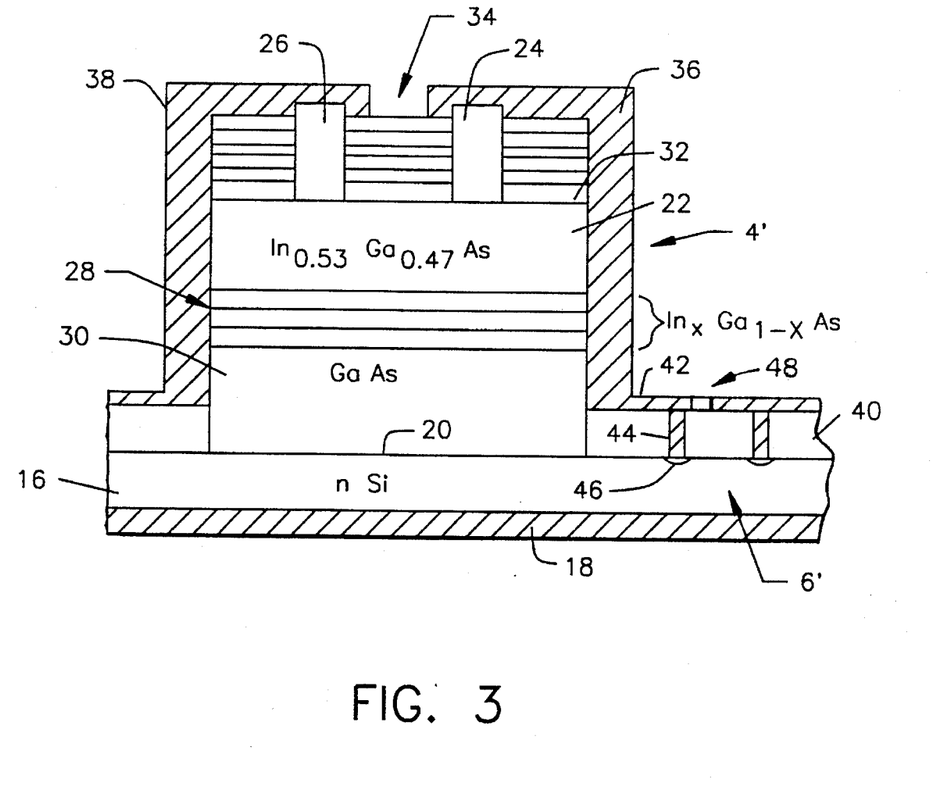
FIG. 3 is a cross sectional view of a monolithic photodetector of this invention in which a mesa structure is used and an optical resonant filter is provided.

FIG. 3 is a cross sectional view 3, 3 of FIG. 2B in which the photodiode $4^1$ is formed on a mesa structure that is selectively epitaxially grown onto a surface 20 of the substrate 16. Only the connection of the photodiode $4^1$ to the input of the readout circuit $6^1$ is shown, but it is understood that the elements of the readout circuit would be formed in the surface 20 by CMOS techniques.

In particular, the photodiode $4^1$ is comprised of an absorption layer 22 of $In_{0.53}Ga_{0.47}As$ that provides more carriers as the intensity of the light with which it is illuminated increases. An ohmic electrode 24 made of AuGe(n) is in electrical contact with one point on the layer 22, and an ohmic electrode 26 made of AuZn(p+) is in electrical contact with the layer 22 so as to form a p-i-n diode between them. Thus as the intensity of the illumination of the layer 22 increases, the current flowing between the electrodes 26 and 24 increases.

If, however, the layer 22 were grown directly on the surface 20 of the substrate 16, which, in this example, is made of n-Si, the difference in the lattice constants would be about 10% so as to produce a large number of dislocations and hence a large leakage current. Therefore, in accordance with one aspect of this invention, the layer 22 is selectively epitaxially grown on a stack 28 of selectively epitaxially grown layers of n $In_xGa_{1-x}As$ in which the value of x increases for subsequently higher layers in the stack. A selectively grown buffer layer 30 of GaAs is between the stack 28 and the surface 20 of the substrate 16. The difference in the lattice constants between adjacent ones of the layer 30, the layers of the stack 28 and the layer 22 is much smaller than 10% so as to reduce the number of dislocations and the leakage current.

An important aspect of this invention is the still further reduction in leakage current by making the cross sectional area of the layer 30, the stack 28 and the layer 22 less than 500 μm².

In this example, all layers have the same area. Also, as indicated the ratio of In to Ga is varied to change the lattice, while the relative amount of As is constant.

In this particular embodiment of the invention, a cap layer 32 of p $Al_{0.48}In_{0.52}As$ is selectively epitaxially grown on top of the diode layer 22, that has a higher band gap than the layer 22 so as to limit the surface leakage currents. Lower band gap surfaces produce higher leakage currents which are not desirable.

Although an optical filter per se is not part of this invention, the photodiode of the invention is adapted for use with any kind of filter and especially adapted for combination with a resonant optical filter. A partially reflective mirror 34 is comprised of alternate layers of $Si_3N_4$ and $SiO_2$ that are formed on the layer 32, and a fully reflective mirror is comprised of the coating 18 on the bottom surface of the substrate 16 by, for example, making it of Au.

The operation of an optical resonant filter is well known so suffice it to say that if the distance between the partially reflective mirror 34 and the fully reflective mirror 18 is one half the wavelength of the light whose intensity is being measured, the light reflected by the mirror 18 will arrive at the mirror 34 in phase with light from the source being measured so as to increase the amount of light passing through the photodiode absorption layer 22. This permits the thickness of the layer 22 to be reduced thereby further decreasing leakage current.

Connection of the electrodes 24 and 26 of the photodiode $4^1$ to the readout circuitry $6^1$ is via metallized paths 36 and 38 respectively. An insulating layer 40 of $SiO_2$ that may be formed by exposure of the surface 20 to air or by processing or both lies on top of the surface 20 of the substrate 16. The metallization process also forms a lead 42 on the layer 40 as well as a through connector 44 to the input 46 of the readout circuit $6^1$, which, if the circuit of FIG. 1A is used, would be the inverting input of the operational amplifier 8. The amplifiers 8 and 14 are not shown but will be formed by CMOS techniques in the surface 20. Additional metallized leads indicated generally at 48 would make the other connections shown in FIG. 1. Although not shown, the lead 38 would be similarly connected to an appropriate point.

Figure 4:
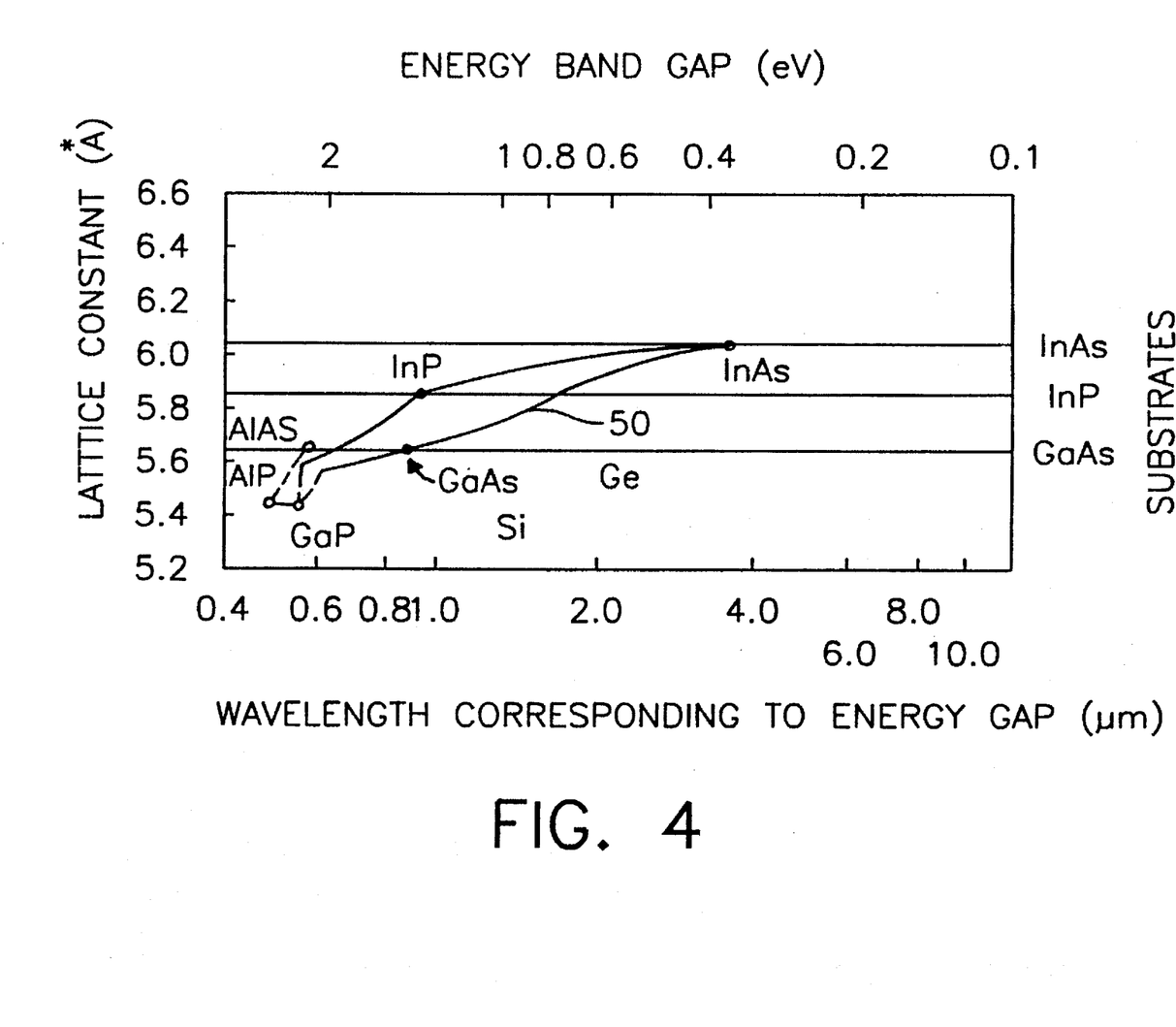
FIG. 4 is a plot of lattice constant, energy band gap and wavelength for different materials.

The graphs of FIG. 4 show the lattice constant, the band gap and the wavelength corresponding to major III–V compound semiconductors. Elementary semiconductors such as Si and Ge and binary compounds such as AlAs and GaAs are indicated as data points having a fixed bandgap and a fixed lattice constant. The tripart alloy $In_xGa_{1-x}As$ is represented by a line 50 joining GaAs and InAs. With increasing In content, the bandgap energy decreases, the cutoff wavelength increases and the lattice constant increases. Thus by lowering the percentage of In in an InGaAs mixture, as noted in Table 1 below, the lattice constant becomes about 5.63 so as to be much closer to the lattice constant of Si, which is about 5.43.

TABLE 1

| Layer | Composition x = | Doping (n type/cm³) | Thickness (μm) |
|---|---|---|---|
| Silicon substrate | | | |
| GaAs buffer | | 5 × 10 18 | 0.246 |
| In(x)(1−x)As | 8% | 5 × 10 18 | 0.246 |
| In(x)Ga(1−x)As | 16% | 5 × 10 18 | 0.246 |
| In(x)Ga(1−x)As | 24% | 5 × 10 18 | 0.246 |
| In(x)Ga(1−x)As | 32% | 5 × 10 18 | 0.246 |
| In(x)Ga(1−x)As | 40% | 5 × 10 18 | 0.246 |
| In(x)Ga(1−x)As | 48% | 5 × 10 18 | 0.246 |
| In(x)Ga(1−x)As | 53% | 5 × 10 17 | 0.246 |
| AlInAs | | | |
| Al 48% | | 5 × 10 16 | 0.246 |
| In 52% | | 5 × 10 18(p-type) | 0.246 |

The thicknesses of the sum of all the graded layers 28 and the layers of the optical resonant filter 34 of FIG. 3 are set forth in Table 2 below.

TABLE 2

| Number | Layer | Thickness (μms) |
|---|---|---|
| 1 | $Si_3N_4$ | 0.213 |
| 2 | $SiO_2$ | 0.291 |
| 3 | $Si_3N_4$ | 0.213 |
| 4 | $SiO_2$ | 0.291 |
| 5 | $Si_3N_4$ | 0.213 |
| 6 | $SiO_2$ | 0.291 |
| 7 | $Si_3N_4$ | 0.213 |
| 8 | $SiO_2$ | 0.291 |
| 9 | $Si_3N_4$ | 0.213 |
| 10 | $SiO_2$ | 0.291 |
| 11 | AlInAs | 0.246 (Cap layer) |
| 12 | $In_{0.53}Ga_{0.47}As$ | 0.246 (Absorption layer) |
| 13 | Graded InGaAs | 1.2 |
| 14 | GaAs buffer | 0.2 |
| 15 | Si substrate | 125 |
| 16 | Gold | Heavy (Opaque) |

Figure 5A:
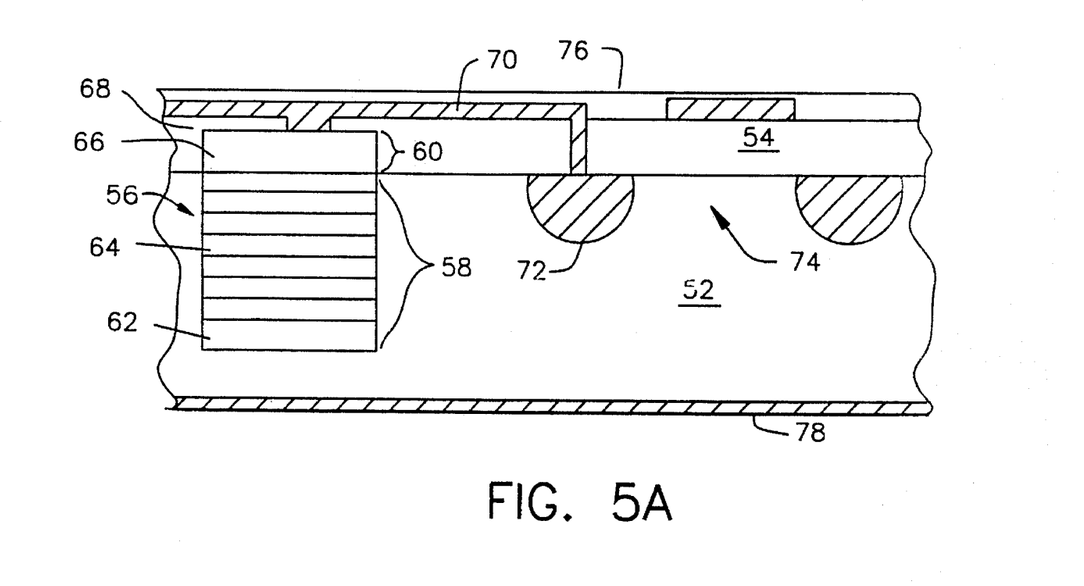
FIG. 5A is a cross sectional view of the preferred photodiode structure showing its coupling to elements of a readout circuit.

Reference is made to FIG. 5A for a description of a preferred embodiment of the invention. A substrate 52 of Si has a layer 54 of $SiO_2$ on top of it, and a well 56 is formed having a lower portion 58 within the substrate 52 and an upper portion 60 within the $SiO_2$ layer 54. A GaAs layer 62 is selectively epitaxially grown on the Si at the bottom of the well 56, and the remainder of the lower portion 58 is filled with selectively epitaxially grown graded layers 64 of $In_xGa_{1-x}$. An absorption layer 66 of $In_xGa_{1-x}As$ and a cap layer 68 of AlInAs are selectively epitaxially grown so as to fill the upper portion 60 of the well 52. A metallized conductor 70 formed on the layer 54 of $SiO_2$ makes contact between the absorption layer 66 and an input 72 of a readout circuit, not shown in detail but generally indicated at 74. An insulating layer 76 of SiN is formed over the entire top of the structure, and a conductive layer 78 is formed on the bottom. The various layers are as set forth by way of example in Table 1. No light filter is shown, but one could be positioned over the top of the well 56. The material within the upper portion 60 of the well 56 is of one conductivity type and the material in the lower portion 58 of the well 56 is of the opposite conductivity type. The substrate 52 is of the same conductivity type as the latter material.

Figure 5B:
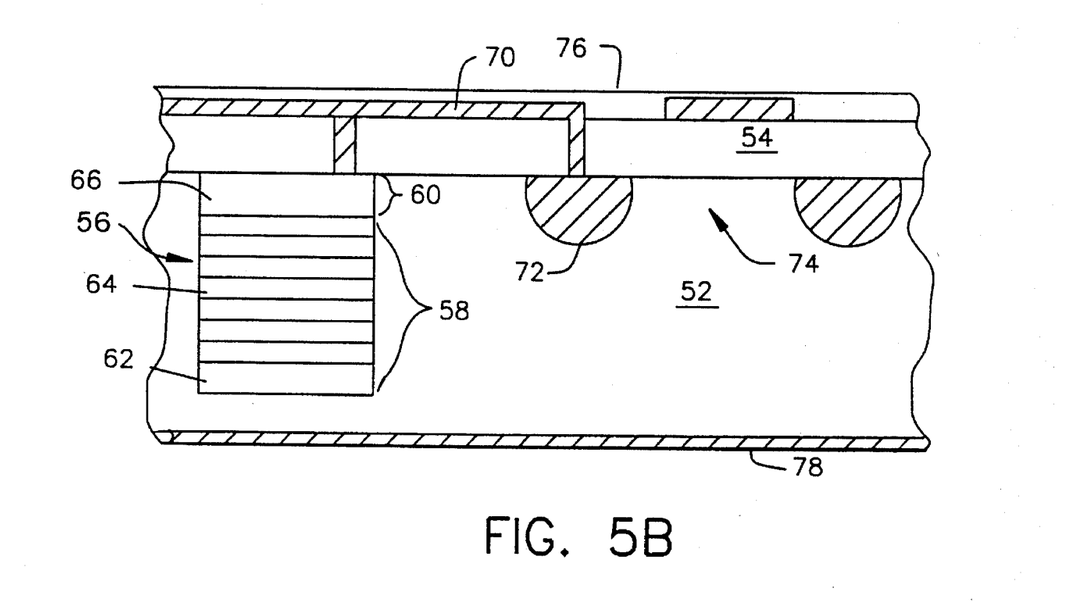
FIG. 5B is a cross sectional view of a slightly different construction of the photodiode of FIG. 5A.

FIG. 5B is the same as FIG. 5A except that the well 56 is deeper so that all of the layers from the GaAs layer 62 to and including the cap layer 68 are within the lower portion 58 of the well 56.

Fabrication Method

The following steps are typically performed on a Si substrate for the formation of the monolithic InGaAs detectors integrated with the CMOS readout circuitry.

TABLE 3

| Step Number | Process Sequence | Remarks |
|---|---|---|
| 1 | Wafer N type | Step (1) through |
| 2 | Clean | (31) are |
| 3 | Denuding | processing steps |
| 4 | Oxidation | for manufacturing |
| 5 | Photo P well | CMOS readout in |
| 6 | Clean | the silicon substrate. |
| 7 | Boron drive | |
| 8 | Remove oxide | |
| 9 | Pad oxide/LPCVD $Si_3N_4$ | |
| 10 | Photo - ACTIVE AREA | |
| 11 | RIE $Si_3N_4$ | |
| 12 | Clean | |
| 13 | Field oxidation | |
| 14 | $Si_3N_4$ removal | |
| 15 | Gate 0 | |
| 16 | Gate 1/LPCVD Poly | |
| 17 | Poly backside removal | |
| 18 | Poly doping | |
| 19 | Photo - POLY | |
| 20 | RIE Poly | |
| 21 | Clean | |
| 22 | Photo N⁺ S&D | |
| 23 | I²N⁺ | |
| 24 | Clean | |
| 25 | Photo P⁺S&D | |
| 26 | I²P⁺ | |
| 27 | Clean | |
| 28 | Drive | |
| 29 | LTO deposition | |
| 30 | Photo - CONTACT 1&2 | |
| 31 | RIE oxide | |
| 32 | Etch "well" or "trough" for epitaxial growth | Steps (32) through (35) denote selective epitaxial growth. |
| 34 | Rinse and dry substrate with dry $N_2$. | |
| 35 | Perform epitaxial growths as indicated in Table 4 below using techniques such as MBE or MOCVD. | |

TABLE 3-continued

| Step Number | Process Sequence | Remarks |
|---|---|---|
| 36 | Sputter Al | Steps (36) through |
| 37 | Photo METAL | (40) are for final |
| 38 | Wet etch Aluminum | metallization and |
| 39 | Clean | passivation of the |
| 40 | Anneal | entire monolithic chip. |

Table 4 below indicates the typical growth parameters used by the present inventor for InGaAs-on-silicon selective epitaxial growth.

TABLE 4

Growth Parameters for InGaAs/GaAs/Si

| Crystal Layer | Temperature | Time |
|---|---|---|
| Silicon Substrate | 850 C | 10 min. |
| GaAs Prelayer | 300 C | 10 min. |
| GaAs Buffer | 600 C | 10 min. |
| $In_{0.1}Ga_{0.9}As$ | 530 C | 6 min. |
| $In_{0.2}Ga_{0.8}As$ | 530 C | 6 min. |
| $In_{0.3}Ga_{0.7}As$ | 530 C | 6 min. |
| $In_{0.4}Ga_{0.6}As$ | 530 C | 6 min. |
| $In_{0.53}Ga_{0.47}As$ | 530 C | 6 min. |
| $Al_{0.48}In_{0.52}As$ | 530 C | 6 min. |

The elements of the readout circuit and the wells have been formed.

The following procedure explains in detail the selective epitaxial growth of InGaAs photodiode structure in the well, as developed by the present inventor.

Substrate Preparation

For InGaAs/GaAs on silicon, a clean substrate is important as even minute amount of contaminants may harm the quality of crystal growth. The III–V compound atoms like Ga or As do not exhibit any first-order preferential nucleation sites on the silicon surface and the contaminants may alter this non-preference leading to a pile up of Ga or As around the contaminant. The contaminants may also act like steps on the silicon surface and form structural and antiphase domains (APDs). Packaging, transportation, exposure to ambient atmosphere lead to an oxide build-up and contamination of the silicon surface. These external contaminants have to be removed from the surface before the crystal growth.

FIG. 6A through 6E illustrate the basic steps in the process.

Figure 6A:
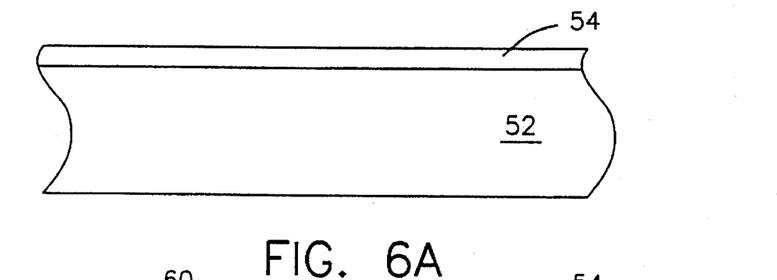
FIGS. 6A, 6B, 6C, 6D and 6E are cross sectional views illustrating successive steps in the fabrication of a preferred specie of a photodiode of this invention.

FIG. 6A corresponds to the cleaning of the substrate 52 with its naturally formed 54 on it. (Ap3 of Report on Selective Epitaxy of $In_xGa_{1-x}As$ on Silicon.

Figure 6B:
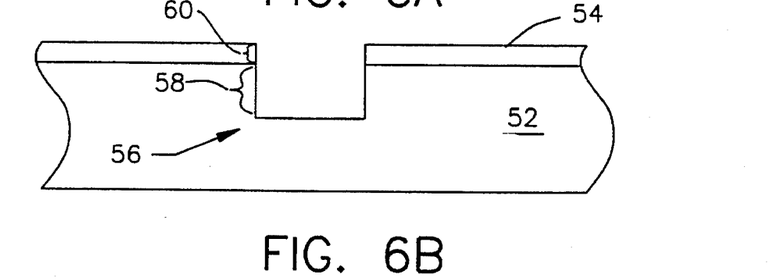

FIG. 6B shows the formation of the well 56 by etching.

Figure 6C:
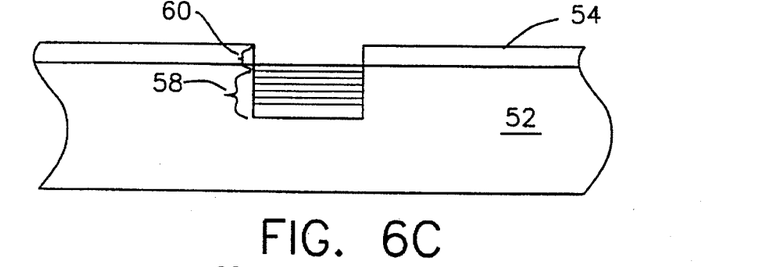

FIG. 6C shows the selective epitaxial growth of the GaAs and $In_xGa_{1-x}As$ layers of one conductivity type that is the same as the conductivity type of the substrate 52 in the lower portion 58 of the well 56.

Figure 6D:
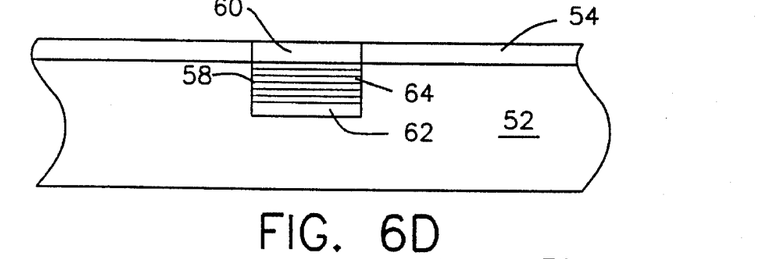

FIG. 6D shows the selective epitaxial growth in the step 35 of Table 3 of the light absorption layer 66 and the cap layer 68 on the upper portion 60 of the well 56.

Figure 6E:
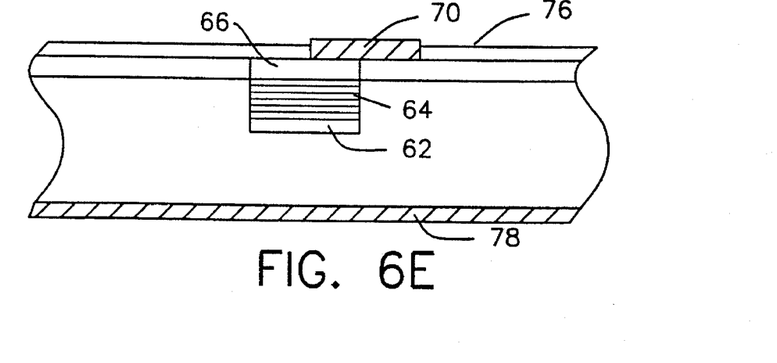

FIG. 6E shows the formation of the circuit connections 70 by metallization as in steps 36 and 40 of Table 3 and the formation of an SiN insulation layer 76.

Figure 7:
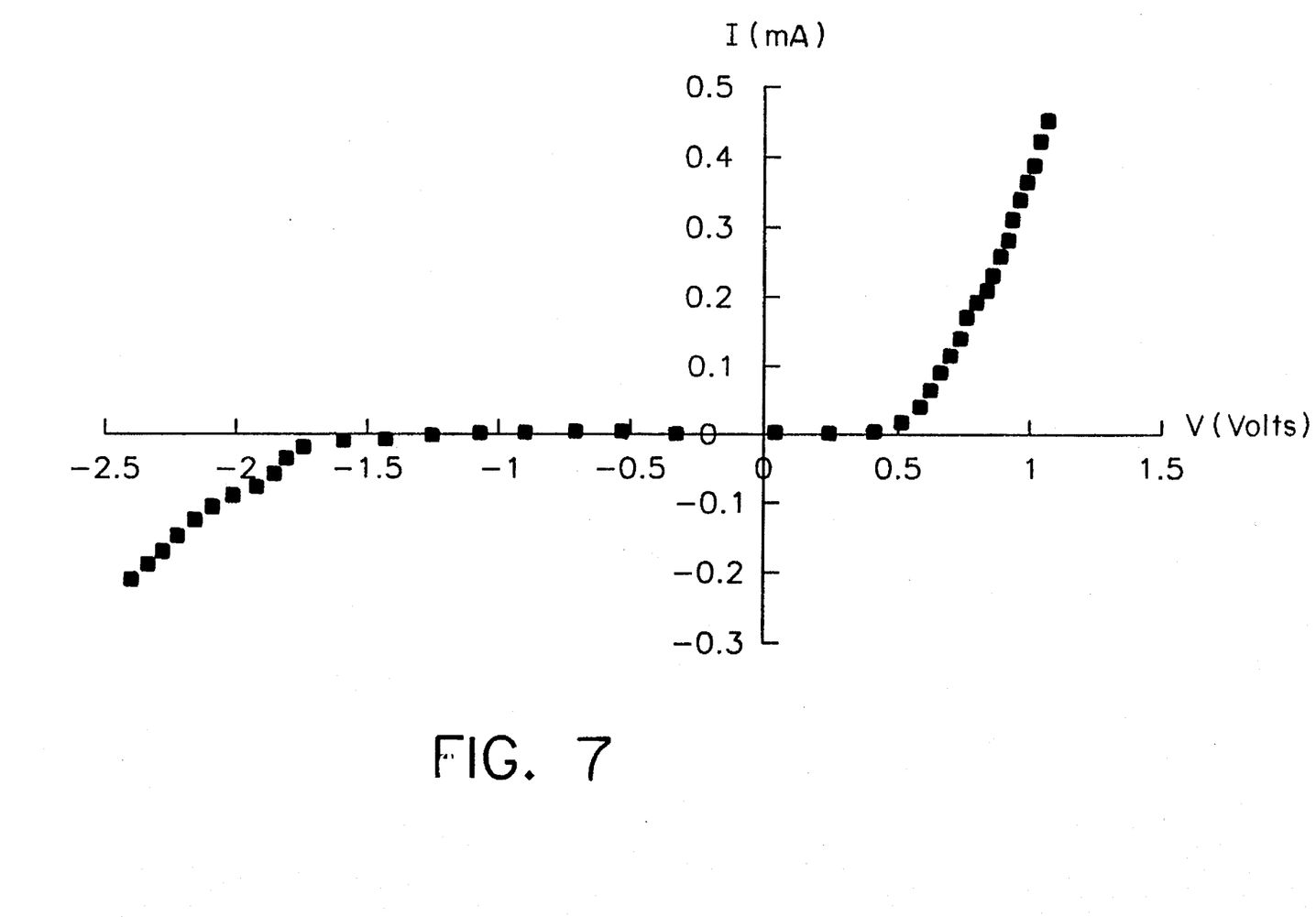
FIG. 7 shows a curve for the forward-reverse I-V characteristic of a 500 μm diameter InGaAs detector selectively grown over silicon, in accordance with one aspect of the invention (the x-axis is in volts and the y-axis is in mA).

As explained in the preceding crystal growth section, the present inventor was successful to selectively grow device grade InGaAs-on-silicon. FIG. 7 shows the forward-reverse I–V characteristics of a 500 μm diameter $In_{0.5}Ga_{0.5}As$ photodetector selectively grown on an n-type silicon substrate, in accordance with the invention. The forward turn-on bias is 0.75V and the reverse breakdown voltage is about 2.5V. The room temperature leakage current for a 50 μm diameter detector is 35 nA for a reverse bias of 10 mV. Being the initial research phase, this is expected as the mismatch between the InGaAs and silicon is 8%. With improved selective epitaxial techniques and more practice of growing these materials, it is believed that the room temperature leakage current density can be reduced to below 1 $\mu A/cm^2$.

Although various embodiments of the invention are described herein for purposes of illustration, they are not meant to be limiting. Those of skill in the art may recognize modifications that can be made in the illustrated embodiments. Such modifications are meant to be covered by the spirit and scope of the appended claims. For example, in FIG. 3, layer 22 of InGaAs can have a composition of Indium and Gallium that can vary from the ratios shown over a wide range. Layer 32 of AlInAs can easily be replaced with InAsP. Also, layers 28 shown as $In_xGa_{1-x}As$ can also be InAsP.

What is claimed is:

1. A monolithic integrated circuit including an InGaAs photodetector diode and silicon readout circuitry comprising:

a substrate of silicon(Si) having planar top and bottom surfaces;

a PN junction forming a photodetector including a plurality of selectively grown epitaxial layers generally parallel to said top surface of said substrate, a plurality of said layers being InGaAs, said layers having an area less than (500×500) $\mu m^2$ for mininizing leakage current, and one of said layers being a topmost layer of InGaAs of opposite conductivity than underlying layers;

circuit elements for a readout circuit wholly formed in said substrate near said PN junction of said photodetector;

a layer of $SiO_2$ on the top surface of said substrate surrounding the area occupied by said PN junction of said photodetector;

metallization on said layer of $SiO_2$ for providing electrical connections between said topmost InGaAs layer and said circuit elements; and metallization on the bottom surface of said substrate for providing a common electrical connection.

2. A monolithic integrated circuit as set forth in claim 1, wherein said PN junction of said photodetector is formed above said top surface of said substrate.

3. A monolithic integrated circuit as set forth in claim 1, further comprising:

said PN junction of said photodetector being formed in a well having a portion of said epitaxial layers in said layer of $SiO_2$, and a portion in said substrate.

4. A monolithic integrated circuit as set forth in claim 1, further comprising:

said PN junction of said photodetector being wholly formed in a well in said substrate.

5. A monolithic integrated circuit as set forth in claim 1, wherein the ratio between the In and Ga decreases in successive compositionally graded epitaxial layers starting with the one nearest the bottom of said substrate.

6. A monolithic integrated circuit comprising:

a silicon(Si) substrate of a first conductivity type having top and bottom surfaces;

a layer of SiO$_2$ on said top surface;

a well etched into said substrate through said layer of SiO$_2$, having a cross sectional area less than (500×500) μm$^2$, a portion of said well being in said substrate, and a remaining portion of said well being in said layer of SiO$_2$;

a plurality of first conductivity type selectively grown epitaxial layers of InGaAs in said portion of said well that is in said substrate;

a second conductivity type selectively grown epitaxial layer of InGaAs in said portion of said well that is in said layer of SiO$_2$, said second conductivity type being opposite in polarity to that of said first conductivity type to form a PN junction with said plurality of first conductivity type selectively grown epitaxial layers;

active devices of a readout circuit formed by CMOS processing wholly in said top surface of said substrate;

means for selective electrically connecting a top portion of said second conductivity type epitaxial layer to said active devices of said readout circuit; and an electrically conductive coating on the bottom surface of said substrate.

7. A monolithic integrated circuit including a photodetector diode and readout circuitry therefore, comprising:

a silicon substrate having top and bottom surfaces;

means for selectively epitaxially forming a mesa including a plurality of InGaAs layers of first conductivity on an area of said top surface that is less than (500×500) μm$^2$ for reducing leakage current in photodetectors;

a selectively grown epitaxial AlInAs layer of second conductivity type formed on the top of said plurality of layers of InGaAs, said second conductivity type being opposite in conductivity to said first conductivity type;

a pair of spaced apart ohmic contacts each extending through said AlInAs layer to the topmost InGaAs layer;

said ohmic contacts being of respective materials such as to form a p-i-n diode with said AlInAs and InGaAs layers;

elements of a readout circuit formed wholly within said top surface of said substrate;

a coating of SiO$_2$ on said top surface of said substrate surrounding said mesa; and metallization means for individually electrically connecting said ohmic contacts through said SiO$_2$ layer to elements of said readout circuit.

8. A monolithic integrated circuit as set forth in claim 7, further comprising:

alternate thin film layers of silicon dioxide and silicon nitride on top of said layer of AlInAs for providing a partially light reflective mirror; and fully light reflective material on said second surface of said substrate.

9. A monolithic integrated circuit including a photodetector diode and readout circuitry therefore, comprising:

a silicon substrate having top and bottom surfaces;

means for selectively epitaxially forming a mesa including a plurality of InGaAs layers of first conductivity on an area of said top surface that is less than (500×500) μm$^2$ for reducing leakage current in photodetectors;

a selectively grown epitaxial InAsP layer of second conductivity type formed on the top of said plurality of layers of InGaAs, said second conductivity type being opposite in conductivity to said first conductivity type;

a pair of spaced apart ohmic contacts each extending through said InAsP layer to the topmost InGaAs layer;

said ohmic contacts being of respective materials such as to form a p-i-n diode with said AlInAs and InGaAs layers;

elements of a readout circuit formed in said top surface of said substrate;

a coating of SiO$_2$ on said top surface of said substrate surrounding said mesa; and metallization means for individually electrically connecting said ohmic contacts through said SiO$_2$ layer to elements of said readout circuit.

10. A monolithic integrated circuit as set forth in claim 9, further comprising:

alternate thin film layers of silicon dioxide and silicon nitride on top of said layer of InAsP for providing a partially light reflective mirror; and fully light reflective material on said second surface of said substrate.

* * * * *

UNITED STATES PATENT AND TRADEMARK OFFICE
CERTIFICATE OF CORRECTION

PATENT NO. : 5,621,227
DATED : April 15, 1997
INVENTOR(S) : Abhay M. Joshi

It is certified that error appears in the above-indentified patent and that said Letters Patent is hereby corrected as shown below:

After the title and before line 1, insert the heading, and paragraph as follows:

--<u>GOVERNMENT SUPPORT</u>

This invention was made with Government support under Contract NAS5-32809 awarded by NASA, and under Contract F30602-95-C-0164 awarded by the Air Force. The Government has certain rights in the invention.--.

Signed and Sealed this

Twenty-sixth Day of September, 2000

Attest:

Q. TODD DICKINSON

*Attesting Officer*      *Director of Patents and Trademarks*